(12) United States Patent
Netter

(10) Patent No.: US 11,588,063 B2
(45) Date of Patent: Feb. 21, 2023

(54) PHOTOVOLTAIC APPARATUS AND ASSEMBLY

(71) Applicant: FLISOM AG, Niederhasli (CH)

(72) Inventor: Thomas Netter, Winterthur (CH)

(73) Assignee: FLISOM AG, Niederhasli (CH)

( * ) Notice: Subject to any disclaimer, the term of this patent is extended or adjusted under 35 U.S.C. 154(b) by 0 days.

(21) Appl. No.: 17/189,041

(22) Filed: Mar. 1, 2021

(65) Prior Publication Data
US 2021/0242356 A1    Aug. 5, 2021

Related U.S. Application Data

(63) Continuation of application No. 16/300,132, filed as application No. PCT/IB2017/000495 on May 3, 2017, now Pat. No. 10,937,916.
(Continued)

(51) Int. Cl.
*H01L 31/048*    (2014.01)
*H02S 40/34*    (2014.01)
(Continued)

(52) U.S. Cl.
CPC ........ *H01L 31/048* (2013.01); *H01L 31/0201* (2013.01); *H01L 31/0504* (2013.01); *H02S 20/00* (2013.01); *H02S 20/23* (2014.12); *H02S 30/10* (2014.12); *H02S 40/34* (2014.12); *H02S 40/36* (2014.12); *Y02B 10/10* (2013.01); *Y02E 10/50* (2013.01)

(58) Field of Classification Search
CPC ............... H01L 31/048; H01L 31/0504; H01L 31/0201; H02S 30/10; H02S 20/23; H02S 40/34
See application file for complete search history.

(56) References Cited

U.S. PATENT DOCUMENTS 2,382,378 A * 8/1945 Bloedorn ........... B65D 43/0233
                                                220/310.1
6,291,761 B1    9/2001 Takada et al.
(Continued)

FOREIGN PATENT DOCUMENTS

| EP | 0625802 A2 | 11/1994 |
| EP | 0874404 A2 | 10/1998 |
| WO | 2012104299 A2 | 8/2012 |

OTHER PUBLICATIONS

International Search Report and Written Opinion for PCT/IB2017/000495, dated Aug. 2, 2017.

*Primary Examiner* — Bethany L Martin
(74) *Attorney, Agent, or Firm* — Patterson & Sheridan, LLP

(57) ABSTRACT

A photovoltaic apparatus (1000) is provided including a front sheet (250) having a first portion (2501) and a second portion (2502). The photovoltaic apparatus further includes a back sheet (210) having a first portion (2101), a second portion (2102), and a first folded portion (2103), where the second portion of the front sheet is disposed between the second portion of the back sheet and the first folded portion of the back sheet. The photovoltaic apparatus further includes one or more photovoltaic devices (100) disposed between the first portion of the front sheet and the first portion of the back sheet, where each of the one or more photovoltaic devices includes an array of photovoltaic cells (105).

20 Claims, 5 Drawing Sheets

Related U.S. Application Data

(60) Provisional application No. 62/336,455, filed on May 13, 2016.

(51) Int. Cl.
  *H01L 31/02*   (2006.01)
  *H02S 20/00*   (2014.01)
  *H02S 40/36*   (2014.01)
  *H02S 30/10*   (2014.01)
  *H02S 20/23*   (2014.01)
  *H01L 31/05*   (2014.01)

(56) References Cited

U.S. PATENT DOCUMENTS

| | | | |
|---|---|---|---|
| 7,829,783 B2 | 11/2010 | Krajewski et al. | |
| 2008/0142071 A1* | 6/2008 | Dorn | H02S 30/20 |
| | | | 136/245 |
| 2012/0240982 A1 | 9/2012 | Corneille | |
| 2012/0260987 A1* | 10/2012 | Yun | H01L 31/0481 |
| | | | 136/259 |

* cited by examiner

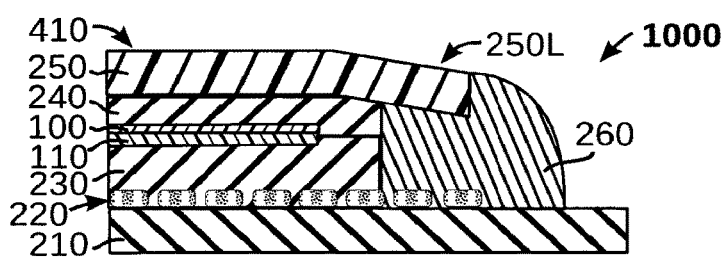
FIG. 1C
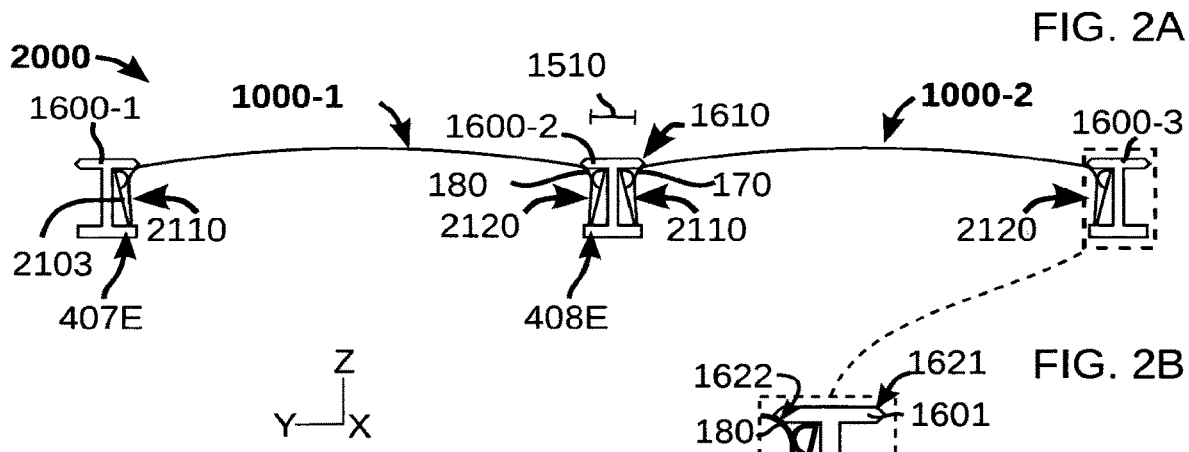
FIG. 2A
FIG. 2B
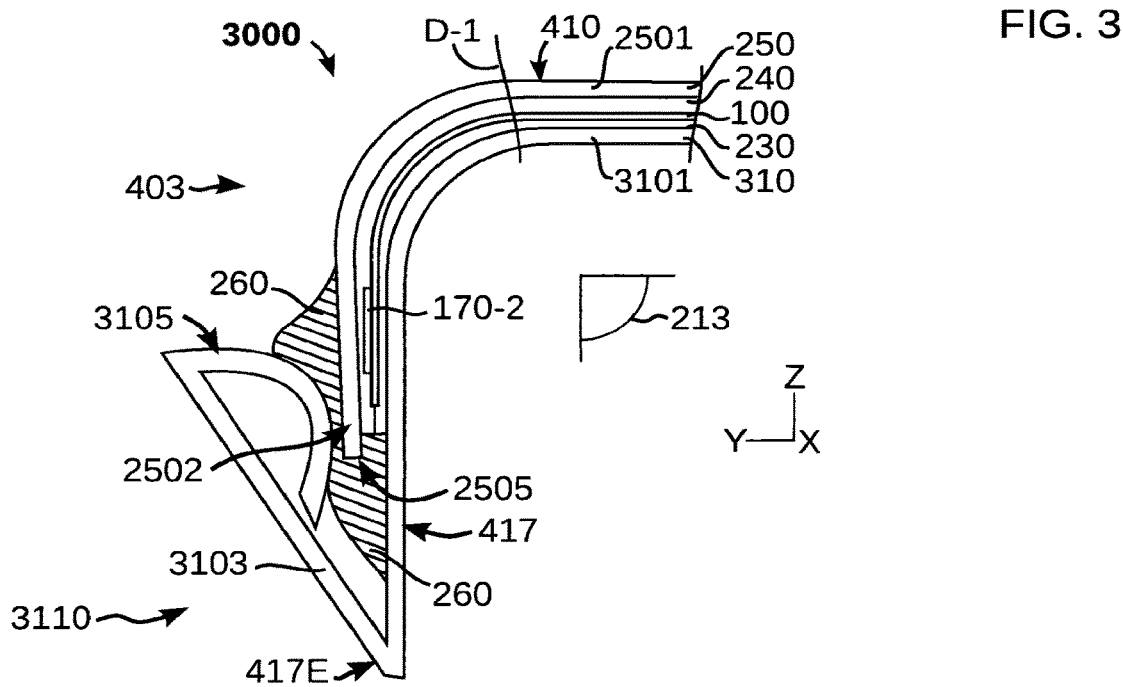
FIG. 3

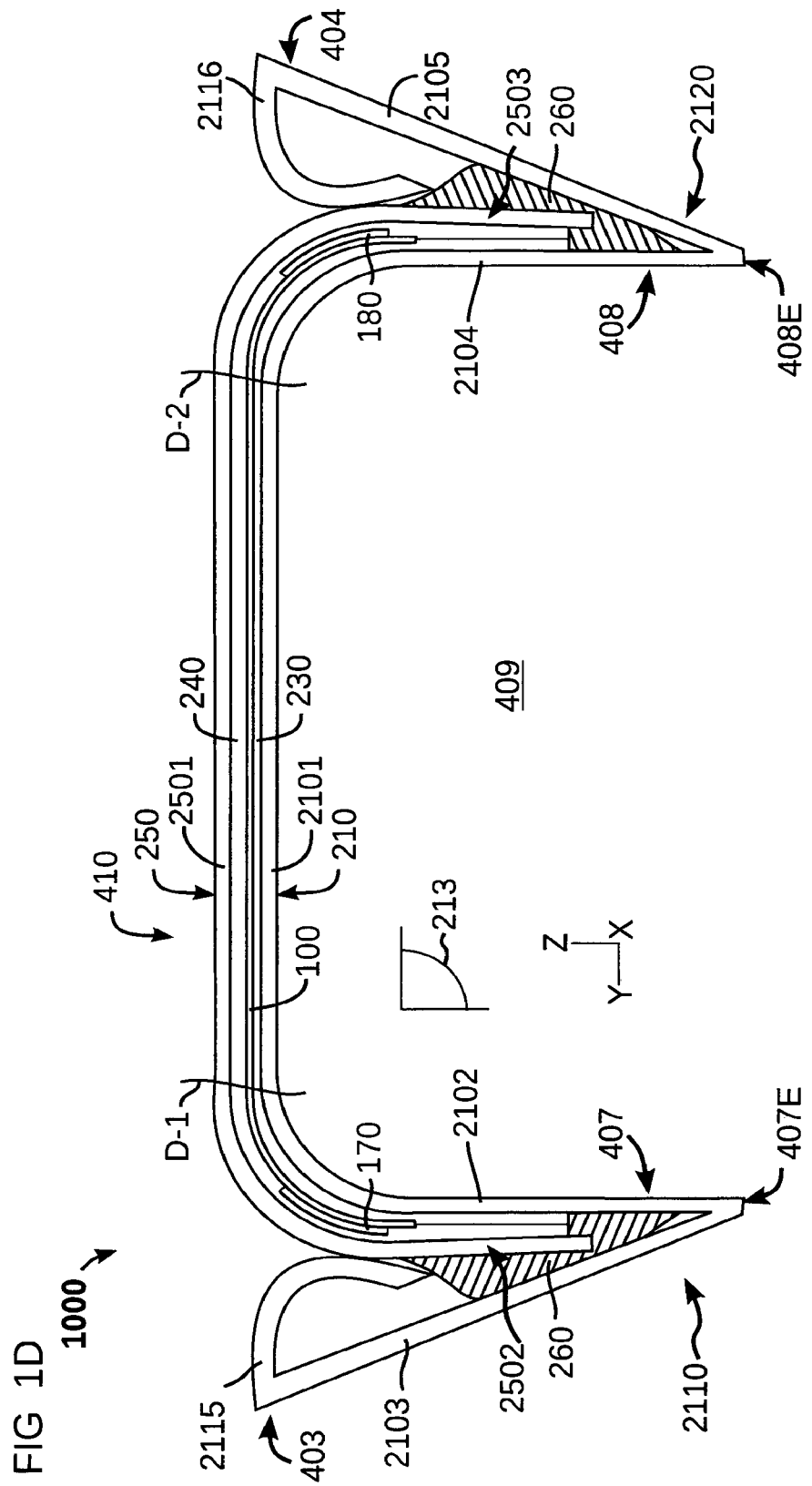

PHOTOVOLTAIC APPARATUS AND ASSEMBLY

CROSS-REFERENCE TO RELATED APPLICATIONS

This application is a continuation of co-pending patent application Ser. No. 16/300,132, filed Nov. 9, 2018 which is a National Stage application under 35 U.S.C. 371 of International Application No. PCT/162017/000495, filed May 3, 2017, which claims benefit of U.S. Provisional Application No. 62/336,455, filed May 13, 2016. The above applications are all incorporated by reference herein.

BACKGROUND

Field

Embodiments of the present disclosure generally relate to photovoltaic apparatuses and assemblies of photovoltaic apparatuses.

Description of the Related Art

The active photovoltaic areas of photovoltaic apparatuses are often surrounded by supporting frames that can be used to route electrical connections and seal the photovoltaic apparatuses from the environment. These supporting frames represent inactive areas of photovoltaic apparatuses that do not produce energy. When multiple photovoltaic modules are arranged across a supporting structure (e.g., a roof), the photovoltaic modules are often positioned so that there is only a small gap between the frames of adjacent photovoltaic modules or the frames can alternatively contact each other to minimize the inactive photovoltaic areas on the supporting structure. However, even when photovoltaic modules contact each other, there is still a significant amount of area of the supporting structure that is not used to produce energy due to the area covered by the frames, which are inactive photovoltaic areas. Another problem with many photovoltaic modules is that thermal cycling can cause the transparent front sheet and/or a busbar of the photovoltaic module to delaminate from the laminated structure of the photovoltaic module. Such delamination can reduce the efficiency of a photovoltaic module and in some cases the delamination can lead to device failure.

For all photovoltaic modules, installation costs of the photovoltaic modules can form a significant portion of the overall costs of a photovoltaic system. Therefore, improvements that can reduce the amount of time required to install photovoltaic modules can reduce the overall cost of a photovoltaic system and make such photovoltaic systems more cost-competitive with traditional energy sources, such as fossil fuels.

Therefore, there is a need for a photovoltaic apparatus that solves one or more of the problems described above.

SUMMARY

Embodiments of the present disclosure generally relate to photovoltaic apparatuses and assemblies of photovoltaic apparatuses. In one embodiment, a photovoltaic apparatus is provided including a front sheet having a first portion and a second portion. The photovoltaic apparatus further includes a back sheet having a first portion, a second portion, and a first folded portion, wherein the second portion of the front sheet is disposed in a space formed between the second portion of the back sheet and the first folded portion of the back sheet. The photovoltaic apparatus further includes one or more photovoltaic devices disposed between the first portion of the front sheet and the first portion of the back sheet, wherein each of the one or more photovoltaic devices includes an array of photovoltaic cells.

In another embodiment, a photovoltaic apparatus is provided including a laminated structure including a first leg having a base, a second leg having a base, and an intermediate portion connecting the first leg to the second leg. The photovoltaic apparatus further includes a front sheet extending through at least part of each of the intermediate portion, the first leg, and the second leg. The photovoltaic apparatus further includes a back sheet extending through at least part of each of the intermediate portion, the first leg, and the second leg, the back sheet including a first folded portion extending from the base of the first leg, wherein an interior region is formed between the first leg and the second leg, and the first folded portion extends outward of the interior region; and an angle between the first leg and the first folded portion is less than 90 degrees. The photovoltaic apparatus further includes one or more photovoltaic devices disposed at least in the intermediate portion, wherein each of the one or more photovoltaic devices includes an array of photovoltaic cells.

In another embodiment, a photovoltaic assembly is provided including one or more photovoltaic apparatuses including at least a first photovoltaic apparatus. Each photovoltaic apparatus includes a laminated structure including a first leg having a base, a second leg having a base, and an intermediate portion connecting the first leg to the second leg. Each photovoltaic apparatus further includes a front sheet extending through at least part of each of the intermediate portion, the first leg, and the second leg. Each photovoltaic apparatus further includes a back sheet extending through at least part of each of the intermediate portion, the first leg, and the second leg, the back sheet including a first folded portion extending from the base of the first leg, wherein an interior region is formed between the first leg and the second leg, and the first folded portion extends outward of the interior region; and an angle between the first leg and the first folded portion is less than 90 degrees. Each photovoltaic apparatus further includes one or more photovoltaic devices disposed at least in the intermediate portion, wherein each of the one or more photovoltaic devices includes an array of photovoltaic cells. The photovoltaic assembly further includes a supporting channel, wherein the first folded portion of the first photovoltaic apparatus is disposed in the supporting channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1C is a side cross-sectional view of the photovoltaic apparatus of FIG. 1A viewed along the section line 1C of FIG. 1A, according to one embodiment.

FIG. 1D is a side cross-sectional view of the photovoltaic apparatus viewed along the section line 1D of FIG. 1A, according to one embodiment.

FIG. 2A is a side view of a photovoltaic assembly, according to one embodiment.

FIG. 2B is a close-up side view of a supporting beam included in the photovoltaic assembly of FIG. 2A, according to one embodiment.

FIG. 3 is a partial side cross sectional view of a photovoltaic apparatus, according to one embodiment

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to photovoltaic apparatuses and assemblies of photovoltaic apparatuses. Embodiments of the present disclosure generally further relate to an arrangement of photovoltaic apparatuses that can be mounted on or connected to a supporting surface, such as a roof, building facade, wall or shading structure of a photovoltaic installation. Embodiments of the present disclosure generally further include the structure of a photovoltaic apparatus and a method of forming the same.

Figure 1A:
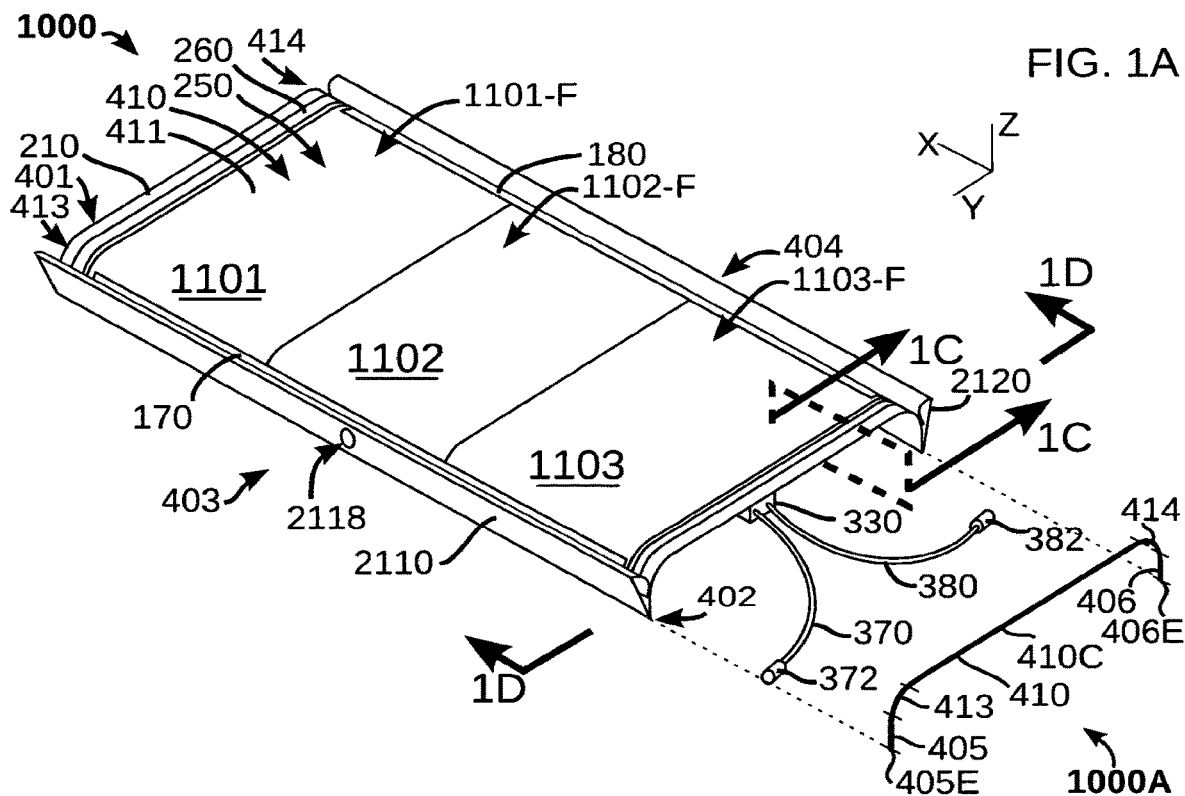
FIG. 1A is a top perspective view of a folded photovoltaic apparatus, according to one embodiment.
Figure 1B:
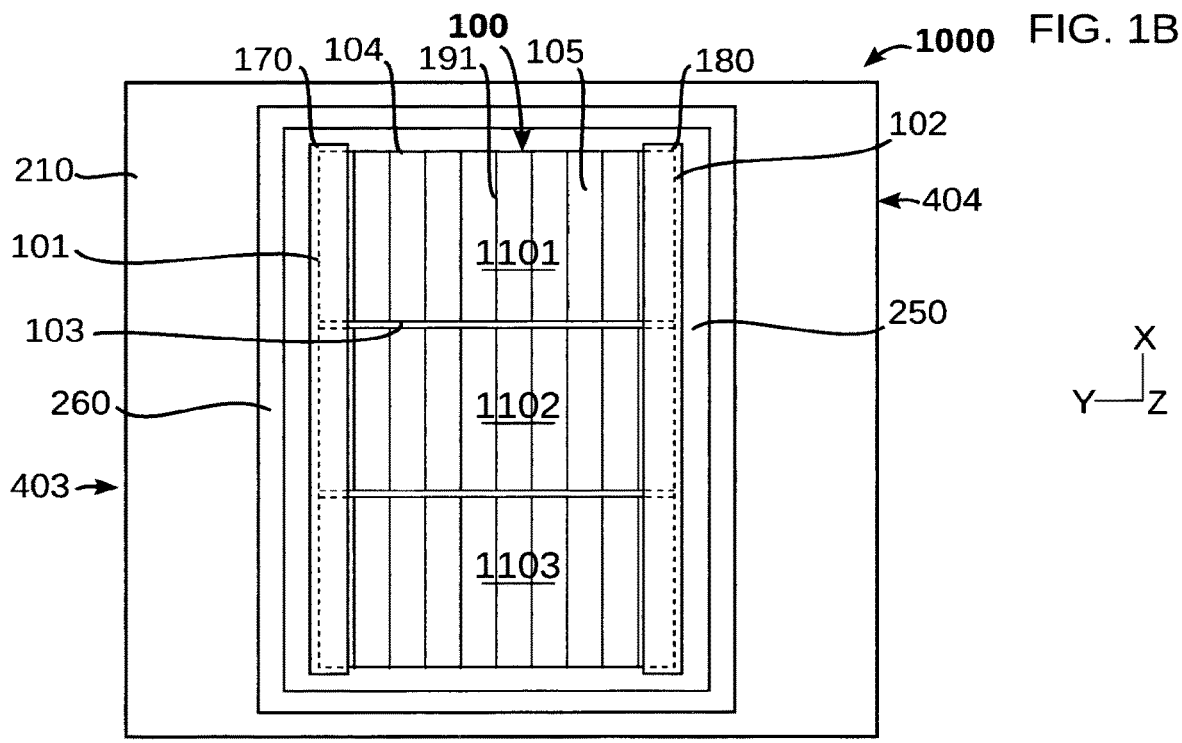
FIG. 1B is a top schematic view of the photovoltaic apparatus of FIG. 1A prior to a folding process performed on the photovoltaic apparatus, according to one embodiment.

FIG. 1A is a top perspective view of a folded photovoltaic apparatus 1000, according to one embodiment. The photovoltaic apparatus 1000 may include multiple optoelectronic devices, such as photovoltaic devices, diodes, and LEDs. The photovoltaic apparatus 1000 is shown including three photovoltaic submodules 1101, 1102, 1103 that each include one photovoltaic device 100 (FIG. 1B). Each photovoltaic device 100 can include multiple photovoltaic cells 105 (FIG. 1B). Each photovoltaic submodule 1101, 1102, 1103 has a respective light-exposed surface 1101-F, 1102-F, 1103-F.

The photovoltaic apparatus 1000 includes a first side 401 and a second side 402. The first side 401 is spaced apart from the second side 402 in the X-direction. The photovoltaic apparatus 1000 further includes a first end 403 and a second end 404. The first end 403 is spaced apart from the second end 404 in the Y-direction. The photovoltaic apparatus 1000 includes a first rigid folded portion 413 folded about a first bend-axis that is parallel to the X-axis at the first end 403 of the photovoltaic apparatus 1000. The photovoltaic apparatus 1000 further includes a second rigid folded portion 414 folded about a second bend-axis that is parallel to the X-axis at the second end 404 of the photovoltaic apparatus 1000. As will be described in further detail below, the folded portions 413, 414 may be rigid, which enables the photovoltaic apparatus 1000 to be quickly installed in orientations that place less active areas of the photovoltaic apparatus 1000, such as areas covered by the busbars, at locations that receive less light than the more active areas of the photovoltaic apparatus 1000. Furthermore, the advantages offered by the rigid folded portions 413, 414 enable multiple photovoltaic apparatuses 1000 to be installed next to each other in such a way that the less active areas of the multiple photovoltaic apparatuses 1000 are placed at locations that receive less light than the active areas of the photovoltaic apparatuses 1000 while the less active areas of the photovoltaic apparatuses 1000 only cover a very small percentage of a surface supporting the photovoltaic apparatuses, such as a roof.

Cutaway 1000A in the lower right-hand corner of FIG. 1A illustrates how the rigid folded portions 413, 414 divide the photovoltaic apparatus into separate portions. For example, the first rigid folded portion 413 connects an intermediate first portion 410 to a second portion 405. The second rigid folded portion 414 connects the intermediate first portion 410 to a third portion 406. The intermediate first portion 410 has a first surface 411 facing the Z-direction. The photovoltaic apparatus 1000 can be positioned on a supporting surface (e.g., a roof), so that the intermediate first portion 410 can face a direction with the most light exposure. Although the intermediate first portion 410 is largely shown as being substantially horizontal having a flat, light-exposed surface, in some embodiments the light-exposed surface of the intermediate first portion 410 can he a curved surface, a convex surface, a concave surface, or a wavy surface.

The second portion 405 can be located in a different position in the Z-direction from the intermediate first portion 410. The third portion 406 can also be located in a different position in the Z-direction from the intermediate first portion 410. The second portion 405 and the third portion 406 can represent portions of the photovoltaic apparatus 1000 that are less active (i.e., portions that generate less photovoltaic energy per unit area) than the intermediate first portion 410. As will be described below, the second portion 405 and the third portion 406 each include a busbar for making electrical connections to one or more of the photovoltaic devices, and these busbars can block light which reduces the amount of photovoltaic energy that can be produced in the second portion 405 and the third portion 406. In some embodiments, the first surface 411 can be substantially flat and the second portion 405 and the third portion 406 can each be substantially perpendicular to the first surface 411. In some embodiments, the first surface 411 can be substantially flat and the second portion 405 and the third portion 406 can each be positioned at an angle to the first surface 411, such as at an angle greater than 85° to a plane that is parallel to the first surface, or an angle greater than or equal to 90° to a plane that is parallel to the first surface. In other embodiments, the first surface 411 can be a curved, convex, concave or wavy surface.

In some embodiments, the rigid folded portions 413, 414 can be replaced by a folded portion having a clearly defined corner, such that the intermediate first portion 410 can meet the first rigid folded portion 413 or second rigid folded portion 414 at a corner without any noticeable curve. The folded portions 413, 414 can form a curve that extends in both the Y and Z-directions. In some embodiments, the second portion 405 and the third portion 406 can extend substantially in a vertical plane (e.g., a unitless slope >8.5 while still possibly including one or more curves), such as the X-Z plane. Similarly, the intermediate first portion 410 can extend substantially in a horizontal plane (e.g., a unitless slope <0.15 while still possibly including one or more curves), such as the X-Y plane. One will note that the use of the phrases vertical plane and horizontal plane herein is not intended to limit the scope of the disclosure provided herein in, and is only intended to describe the orientation of the planes relative to each other versus the orientation of the planes to the world since the photovoltaic apparatus 1000 can be installed or positioned in any desired orientation when in use.

The photovoltaic apparatus 1000 includes a first busbar 170 extending adjacent to the first end 403 of the photovoltaic apparatus 1000 and a second busbar 180 extending adjacent to the second end 404 of the photovoltaic apparatus 1000. The busbars 170, 180 can be used to make electrical connections, for example electrical connections of opposite polarity, to the photovoltaic devices 100 shown in FIG. 1B. The busbars 170, 180 can be formed of a rigid or flexible material. The busbars 170, 180 are generally formed of a non-transparent conductive material, such as a conductive metal (e.g. a copper busbar) that is disposed over a portion of the photovoltaic device (i.e., the light-exposed side). Thus, the areas where the non-transparent busbars of a photovoltaic apparatus are positioned generally include areas that do not generate energy.

In some embodiments, the first busbar 170 can be disposed partially or entirely in the second portion 405. Similarly, the second busbar 180 can be disposed partially or entirely in the third portion 406. By positioning the busbars 170, 180 in the corresponding portions 405, 406, the busbars 170, 180 are located on a portion of the photovoltaic apparatus 1000 that receives, over the course of an average day, less light per unit area than portions oriented to generate energy. When two photovoltaic apparatuses 1000 are placed closely next to each other, for example in an adjacent configuration, such that a busbar in one of the photovoltaic apparatuses 1000 is facing a busbar in the other photovoltaic apparatus 1000 (e.g., within less than 5 centimeters, such as less than 1 cm), these two busbars can be located on portions of the respective photovoltaic apparatuses that may receive even less light on average because of mutual shading of these portions by the adjacent photovoltaic apparatuses 1000. By positioning the busbars 170, 180 in areas that receive less light on average, a larger proportion of a structure's supporting surface (e.g., exterior surface of a roof) can be covered by the active areas of the photovoltaic apparatuses 1000 that generate energy. Furthermore, the portions 405, 406 can be oriented substantially perpendicular to the intermediate first portion 410 as well as substantially perpendicular to the supporting structure (e.g., a roof), which substantially reduces the surface area of the supporting structure that the portions 405, 406 cover. Therefore, more energy can be generated for a given large area of the surface of the supporting structure (i.e., an area large enough to support multiple photovoltaic apparatuses spaced apart from each other on the supporting structure) covered by the photovoltaic apparatuses 1000 than by a similar photovoltaic apparatus that does not include the portions 405, 406.

The photovoltaic apparatus 1000 can further include a first rail 2110 and a second rail 2120. The rails 2110, 2120 can be formed of folded portions of a back sheet 210 described in fuller detail below. The rails 2110, 2120 can be used to reduce the amount of time to install the photovoltaic apparatus 1000. For example, in one embodiment the rails 2110, 2120 can be snapped into respective channels, such as channels formed in respective I-beams that are mounted to a supporting surface, such as a roof. In some embodiments, the rails 2110, 2120 can also apply a pressure to the first surface 411 or other exposed surfaces, which can help to prevent delamination of the front sheet 250 (described in fuller detail in reference to FIG. 1C) and the respective busbars 170, 180. The rail can extend for all or for portion of the length of the photovoltaic apparatus 1000 in the X-direction. Furthermore, in some embodiments the rails 2110, 2120 may include one or more orifices 2118 to promote drainage of water that may accumulate inside the rails 2110, 2120.

The photovoltaic apparatus 1000 can further include a junction box 330. The junction box 330 includes a first cable 370 having a first connector 372. Although not shown the first cable 370 can be electrically connected to the first busbar 170 by use of one or more junction busbars or other conductors. The junction box 330 further includes a second cable 380 having a second connector 382. Although not shown the second cable 380 can be electrically connected to the second busbar 180 by use of one or more junction busbars or other conductors. The junction box 330 can be used to electrically connect the photovoltaic apparatus 1000 to an external device, such as another photovoltaic apparatus 1000, a charge controller or other electronics for charging one or more power sources (e.g., a battery bank), or electrical systems that may be used to feed electrical power to an electrical grid.

FIG. 1B is a top schematic view of the photovoltaic apparatus 1000 prior to bending the photovoltaic apparatus 1000 to form the rigid folded portions 413, 414 and the rails 2110, 2120, according to one embodiment. The top schematic view of FIG. 1B illustrates the layout of different components in the photovoltaic apparatus 1000 although some of these components may not actually be visible in a top view. The photovoltaic apparatus 1000 includes the three photovoltaic submodules 1101, 1102, 1103. Each photovoltaic submodule 1101, 1102, 1103 includes a photovoltaic device 100. Other embodiments of the photovoltaic apparatus 1000 may include more than three photovoltaic devices 100 spaced apart from each other in the X-direction and/or the Y-direction. These other embodiments of the photovoltaic apparatus 1000 can include, for example, photovoltaic devices 100 connected in series or in parallel as well as photovoltaic devices 100 that are not electrically connected to each other.

The photovoltaic device 100 includes an array of photovoltaic cells 105 extending from a first end 101 to a second end 102 in the Y-direction. Individual photovoltaic cells 105, extend from a first side 103 to a second side 104 of the photovoltaic device 100 in the X-direction. Serial interconnects 191 (e.g., monolithic serial interconnects) electrically divide the photovoltaic cells 105, so that consecutive photovoltaic cells 105 in the array are connected in series. In some embodiments, the serial interconnects 191 and the folding axis for one or more of the folded portions 413, 414 can extend in the same direction (e.g., the X-direction).

Furthermore, in some embodiments, the serial interconnect 191 between one or more pairs of photovoltaic cells 105 in the array can be located in one of the rigid folded portions 413, 414. The serial interconnects 191 of the photovoltaic device 100 can be areas with greater flexibility than other areas of the photovoltaic device 100, so forming the folded portions 413, 414 about a folding axis that extends in the same direction as the serial interconnects 191 or that coincide with the serial interconnects 191 can place less stress on the photovoltaic apparatus 1000 during folding. Furthermore, in some embodiments the serial interconnects 191 can be thicker in the Y-direction (i.e., the direction of the array) for serial interconnects located in the folded or curved portions 413, 414, to further enhance the flexibility of the photovoltaic apparatus 1000 at the folded portions 413, 414.

In some embodiments, a bypass diode (not shown) may be electrically connected in parallel to locations of opposite polarity of individual photovoltaic cells 105 that are in the folded portions 413, 414. For example, in one embodiment a bypass diode may be connected in the reverse bias direction to the busbar 170 and the serial interconnect 191 between the first photovoltaic cell 105 and the second photovoltaic cell 105 in the array. Using bypass diodes in these locations can help prevent the effects of having portions of one or more of the photovoltaic cells 105 that are shaded from the sun (e.g., reverse bias effect) and/or hot-spot heating. Thus, in some embodiments, it is desirable to form the photovoltaic apparatus 1000 such that none of the photovoltaic cells 105 are shaded, or even partially shaded, during normal use within an array of photovoltaic apparatuses. In other words, in some embodiments, all of the photovoltaic cells 105 (e.g., active portion of the photovoltaic device) are substantially disposed within the intermediate first portion 410. In other embodiments, only a small portion of the last photovoltaic cells 105 disposed at either end of the photovoltaic apparatus 1000 in the Y-direction is disposed in the rigid folded portions 413, 414. In other embodiments, only a small portion of the last photovoltaic cells 105 disposed at either end of the photovoltaic apparatus 1000 in the Y-direction is disposed in the portions 405, 406.

After the photovoltaic apparatus 1000 is folded (i.e., folds or curves 413, 414 are formed), the first end 101 of each photovoltaic device 100 can be located in the second portion 405 (FIG. 1A) and the second end 102 can be located in the third portion 406 (FIG. 1A). Placing the ends 101, 102 in the portions 405, 406 allows the portions of the photovoltaic device 100 that are covered by the busbars 170, 180 to be oriented substantially perpendicular to the supporting surface (e.g., a roof), so that these lower power-generating portions of the photovoltaic device 100 do not cover a significant proportion of the surface area exposed to the sun and the surface area of the supporting surface of the photovoltaic installation.

FIG. 1C is a side cross-sectional view of the photovoltaic submodule 1103 of the photovoltaic apparatus 1000 viewed along the section line 1C of FIG. 1A, according to one embodiment. The view in FIG. 1C shows the layers of the photovoltaic apparatus 1000 in the intermediate first portion 410, which is away from the rigid folded portions 413, 414 of the photovoltaic apparatus 1000. The photovoltaic submodules 1103 of the photovoltaic apparatus 1000 includes the photovoltaic device 100 introduced above. The photovoltaic device 100 is formed on a substrate 110. In some embodiments, the substrate 110 may be a rigid substrate. In other embodiments, the substrate 110 can be a flexible substrate. Other embodiments may include a plurality of substrates, for example stacked on top of one another, in which some of the substrates are rigid and some of the substrates are flexible. The substrate 110 may also be formed from an electrically insulating material. For example, in one embodiment a polyimide substrate may be used, such as a polyimide substrate having a thickness in the Z-direction from about 5 μm to about 200 μm, such as from about 15 μm to about 100 μm.

In some embodiments, the photovoltaic device 100 can be thin-film layers deposited on the substrate 110, such as scribed thin-film layers including a plurality of monolithically interconnected photovoltaic cells, such as the photovoltaic cells 105 described above. In other embodiments, the photovoltaic device 100 can include a photovoltaic device formed on another substrate that is then positioned on the substrate 110.

The photovoltaic device 100 can be formed of, for example, a back-contact layer formed on the substrate 110, an absorber layer formed over the back-contact layer, and a front-contact layer formed over the absorber layer. The back-contact layer can be fabricated from a material having a high optical reflectance and is commonly made of molybdenum (Mo) although several other thin-film materials, such as metal chalcogenides, molybdenum chalcogenides, molybdenum selenides (such as $MoSe_2$), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer is deposited onto the substrate 110 by use of sputtering process.

The absorber layer is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the Cu(In,Ga)Se2 semiconductor also known as CIGS. In some embodiments, the absorber layer may be a polycrystalline material. In other embodiments, the absorber layer may be a monocrystalline material. Another example of a material that may be used as the absorber layer is chalcopyrite.

The front-contact layer can be an electrically conductive and optically transparent material, such as a transparent conductive oxide (TCO) layer. For example, in some embodiments, the front-contact layer may be formed of doped or non-doped variations of materials, such as indium oxides, tin oxides, or zinc oxides.

In some embodiments, a semiconductive buffer layer can be disposed between the absorber layer and the front-contact layer. The semiconductive buffer layer ordinarily has an energy bandgap higher than 1.5 eV. The semiconductive buffer layer may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

The first busbar 170 (FIG. 1B) forms an electrical connection to the first end 101 of the photovoltaic device 100, such as to the back-contact layer through a connection region of the front-contact layer of the photovoltaic device 100 that is coupled to the back-contact layer at the first end 101 of the photovoltaic device 100. The first busbar 170 may be a conductive material that forms the cathode of the photovoltaic device 100. In some embodiments, the first busbar 170 may be formed of a flexible material.

The second busbar 180 (FIG. 1B) forms an electrical connection to the second end 102 of the photovoltaic device 100, such as to the front-contact layer of the photovoltaic device 100 at the second end 102 of the photovoltaic device 100. The second busbar 180 may be a conductive material that forms the anode of the photovoltaic device 100. In some embodiments, the second busbar 180 may be formed of a flexible material.

The photovoltaic device 100 may be encapsulated within the photovoltaic apparatus 1000 by use of a front-side adhesive 240 and a back-side adhesive 230. In some embodiments, the front-side adhesive 240 and the back-side adhesive 230 completely surround and encapsulate the photovoltaic device 100. The front-side adhesive 240 is formed over the front-contact layer of each of the photovoltaic device 100, and also over the first and second busbars 170, 180. The front-side adhesive 240 may be formed of a flexible material, such as a flexible polymer. For example, in one embodiment the front-side adhesive 240 may be formed of a thermoplastic olefin (TPO) based polymer or a TPO blend.

The back-side adhesive 230 is disposed over the side of the substrate 110 that is opposite to the side that the photovoltaic device 100 is formed on. The back-side adhesive 230 may be formed of a flexible material, such as a flexible polymer. For example, in one embodiment the back-side adhesive 230 may be formed of a thermoplastic olefin-based polymer (TPO) or a TPO polymer blend. The back-side adhesive 230 may contact the front-side adhesive 240 at each side of the photovoltaic device 100 (i.e., along the sides 401, 402 of the photovoltaic apparatus 1000 in FIG. 1A) and also at either end of the photovoltaic device 100 (i.e., along the ends 403, 404 of the photovoltaic apparatus 1000 of FIG. 1A), so that the front-side adhesive 240 and the back-side adhesive 230 completely surround and encapsulate the photovoltaic device 100.

Referring to FIGS. 1A and 1C, a front sheet 250 can be disposed on an outer surface of the front-side adhesive 240, such as a top surface of the front-side adhesive 240. The front sheet 250 can be formed of a transparent material, such as glass or a transparent thermoplastic polymer. In some embodiments, the front sheet 250 may be formed of a rigid material or a material that is rigid at ambient temperature. In other embodiments, the front sheet 250 may be formed of a flexible material. In other embodiments, the front sheet 250 may be formed of an assembly of flexible and rigid materials. The front sheet 250 can extend at least partially through each of the second portion 405, the first rigid folded portion 413, the intermediate first portion 410, the second rigid folded portion 414, and the third portion 406. In some embodiments, the front sheet 250 can extend in the Y-direction across the entire first rigid folded portion 413, the entire intermediate first portion 410, and the entire second rigid folded portion 414.

The outer surface of the back-side adhesive 230, such as a bottom surface of the back-side adhesive 230, can be disposed on a back sheet 210. The back sheet 210 may include a reflective material, such as a metallic layer, a reflective polymer or a polymer with a reflective layer (e.g., metal foil). In some embodiments, the back sheet 210 may be formed of a rigid material, such as a bendable rigid material. In other embodiments, the back sheet 210 may be formed of a flexible material, such as a bendable flexible material. In some embodiments, the back sheet 210 can be formed of a non-transparent material, such as a non-transparent metal. Other examples of materials that may be used to form the back sheet 210 include metal, stainless steel, aluminum, polymers, and fiber-reinforced polymers. Referring to FIG. 1A, the back sheet 210 can extend at least partially through each of the second portion 405, the first rigid folded portion 413, the intermediate first portion 410, the second rigid folded portion 414, and the third portion 406. In some embodiments, the back sheet 210 can extend in the Y-direction across the entire second portion 405, the entire first rigid folded portion 413, the entire intermediate first portion 410, the entire second rigid folded portion 414, and the entire third portion 406. The photovoltaic device 100 is disposed between the front sheet 250 and the back sheet 210. In some embodiments, photovoltaic devices 100 are disposed between the front sheet 250 and the back sheet 210 in each of the intermediate first portion 410, the second portion 405, the third portion 406, the first rigid folded portion 413, and the second rigid folded portion 414.

In some embodiments, the front sheet 250 can include an outer portion 250L that is bent towards the back sheet 210. The bending of the outer portion 250L can be caused by pressure placed on the front sheet 250 during a lamination process used to adhere the different layers of the photovoltaic apparatus 1000 to each other.

The photovoltaic apparatus 1000 can further include an edge seal 260. The presence of the edge seal 260 at the edge of the photovoltaic apparatus 1000 can eliminate common photovoltaic apparatus manufacturing and photovoltaic device failure modes, such as ingress of moisture to the interior of the photovoltaic apparatus 1000. In general, the edge seal 260 comprises a polymeric material, such as an elastomer, for example a butyl rubber that can be formed by dispensing a liquid precursor material along the edge of the photovoltaic apparatus 1000 and allowing it to cure. The edge seal 260 can be disposed between the back sheet 210 and the front sheet 250.

In some embodiments, the photovoltaic apparatus 1000 can further include a plurality of rovings 220 or other spacing material. The plurality of rovings 220 can be positioned on the back sheet 210 in some embodiments. Each roving 220 can be formed of a bundle of organic or inorganic fibers. The fibers in the rovings 220 may be formed of a fibrous material, such as fiberglass. In other embodiments, the rovings 220 may be formed of another fiber material, such as a carbon fiber material, or of a fabric. In other embodiments, the rovings 220 may be formed of a layer of a unidirectional glass fiber with a non-woven binder.

The rovings 220 can be embedded in the back-side adhesive 230 during a lamination process, which is used to form the photovoltaic apparatus 1000. Because the rovings 220 can be formed from a rigid material that can be arranged in a desirable structural pattern or orientation, such as fiberglass, the rovings 220 can be used to maintain a spacing between an electrically active component of the photovoltaic device 100, such as the back-contact layer described above, and an external object. Furthermore, a material such as fiberglass generally does not substantially shrink or compress over time, which enables spacing between electrically active components and external objects to be maintained over time in the photovoltaic apparatus 1000. Maintaining adequate spacing between electrically active components of the photovoltaic device 100, such as the back-contact layer described above, and an external object can help to prevent occurrences of arcing.

FIG. 1D is a side cross-sectional view of the photovoltaic apparatus 1000 viewed along the section line 1D of FIG. 1A, according to one embodiment. The photovoltaic apparatus 1000 can be formed of a laminated structure including a first leg 407 having a base 407E, a second leg 408 having a base 408E, and an intermediate first portion 410 connecting the first leg 407 to the second leg 408. Dividing line D-1 illustrates the approximate position where the intermediate first portion 410 ends and the first leg 407 begins. Dividing line D-2 illustrates the approximate position where the intermediate first portion 410 ends and the second leg 408 begins. Angle 213 shows that the straight portion of the legs 407, 408 can be substantially at a right angle with respect to intermediate first portion. 410 In some embodiments, the legs 407, 408 may be oriented at angles other than right angles with respect to the intermediate first portion 410.

The first leg 407 can include the second portion 405 and the first rigid folded portion 413 shown in FIG. 1A. Similarly, the second leg 408 can include the third portion 406 and the second rigid folded portion 414 shown in FIG. 1A. The photovoltaic apparatus 1000 further includes the rails 2110, 2120, which can be used to reduce the time required tor installation of the photovoltaic apparatus 1000 and to help prevent the busbars 170, 180 and layers in the photovoltaic apparatus, such as the from sheet 250, from delaminating from the laminated structure of the photovoltaic apparatus 1000. The first rail 2110 extends from the base 407E of the first leg 407. The second rail 2120 extends from the base 408E of the second leg 408.

For the photovoltaic apparatus 1000, the front sheet 250 can extend through all of the intermediate first portion 410, part of the first leg 407, and part of the second leg 408. However, in some embodiments, the front sheet 250 extends through at least part of each of the intermediate first portion 410, the first leg 407, and the second leg 408. The front sheet 250 of the photovoltaic apparatus 1000 includes a first portion 2501 disposed in the intermediate first portion 410, a second portion 2502 disposed in the first leg 407, and a third portion 2503 disposed in the second leg 408.

The back sheet 210 of the photovoltaic apparatus 1000 can extend through all of the intermediate first portion 410, all of the first leg 407, and all of the second leg 408. However, in some embodiments, the back sheet 210 extends through at least part of each of the intermediate first portion 410, the first leg 407, and the second leg 408. The back sheet 210 of the photovoltaic apparatus 1000 includes a first portion 2101 in the intermediate first portion 410, a second portion 2102 in the first leg 407, and a third portion 2103 (first folded portion) extending from the base 407E of the first leg 407.

An interior region 409 is formed between the first leg 407 and the second leg 408. The third portion 2103 of the back sheet 210 extends outward the interior region 409 from the base 407E. An interior angle between the first leg 407 and the third portion 2103 of the back sheet 210 can be less than 90 degrees. The back sheet 210 further includes a first curved portion 2115 extending from the third portion 2103 back towards the front sheet 250. The curved portion 2115 can be used to apply a pressure against the front sheet 250, such as applying pressure against the second portion 2502 of the front sheet 250. In some embodiments, the first curved portion 2115 can contact the front sheet 250, such as contact the second portion 2502 of the front sheet 250. In some embodiments, the first curved portion 2115 can have a rounded shape, such as a convex shape. Furthermore, in some embodiments, the first curved portion can have a cross-sectional thickness that allows it to deform elastically when pressure is applied to the first rail 2110 towards the front sheet 250. This elastic deformation can help to distribute the force applied by the curved portion 2115 to the front sheet 250 over a larger area of the front sheet 250, which can be beneficial for preventing the delamination of the front sheet 250 relative to applying all of the pressure on a smaller area of the front sheet 250.

The second portion 2502 of the front sheet 250 can be disposed in a space formed between the second portion 2102 of the back sheet 210 and the third portion 2103 of the back sheet 210 allowing the second portion 2502 of the front sheet 250 to be compressed between the second portion 2102 of the back sheet 210 and the third portion 2103 of the back sheet 210. In some embodiments, the pressure is applied by the curved portion 2115 and indirectly by the third portion 2103. Furthermore, the busbar 170 can be disposed between the third portion 2103 of the back sheet 210 and the second portion 2102 of the back sheet 210. Placing the second portion 2502 of the front sheet 250 and the busbar 170 between the second portion of the back sheet 210 and the third portion 2103 of the back sheet 210 can help prevent the front sheet 250 and the busbar 170 from delaminating from the laminated structure of the photovoltaic apparatus 1000 when the third portion 2103 or the first curved portion 2115 applies a pressure against the front sheet 250 after the rail 2110 of the photovoltaic apparatus 1000 is placed in a supporting channel as described below in reference to FIGS. 2A, 2B.

The edge seal 260 can be placed in areas between the third portion 2103 of the back sheet 210 and the second portion 2102 of the back sheet 210, between the third portion 2103 of the back sheet 210 and the front sheet 250 as well as between the curved portion 2115 and the front sheet 250. In some embodiments, the edge seal 260 can extend from an inner corner where the second portion 2102 meets the third portion 2103 to the front sheet 250 and adhesive layers 230, 240, and to an end of the curved portion 2115. The edge seal 260 can be placed in similar voids formed between the second rail 2120 and corresponding portions of the photovoltaic apparatus 1000.

The back sheet 210 further includes a fourth portion 2104 in the second leg 408, and a fifth portion 2105 (second folded portion) extending from the base 408E of the second leg 408. An interior angle between the second leg 408 and the fifth portion 2105 of the back sheet 210 can be less than 90 degrees. The back sheet 210 further includes a second curved portion 2116 extending from the fourth portion 2104 back towards the front sheet 250. The second curved portion 2116 can be used to apply a pressure against the front sheet 250, such as applying pressure against the third portion 2503 of the front sheet 250. In some embodiments, the second curved portion 2116 can contact the front sheet 250, such as contact the third portion 2503 of the front sheet 250. The third portion 2503 of the front sheet 250 can be disposed in a space formed between the fourth portion 2104 of the back sheet 210 and the fifth portion 2105 of the back sheet 210 allowing the third portion 2503 of the front sheet 250 to be compressed between the fourth portion 2104 of the back sheet 210 and the fifth portion 2105 of the back sheet 210.

One or more of the photovoltaic devices 100 can be disposed at least in the intermediate first portion 410 between the first portion 2501 of the front sheet 250 and the first portion 2101 of the back sheet 210. Furthermore, one or more of the photovoltaic devices 100 can be disposed between the second portion 2502 of the front sheet 250 and second portion 2102 of the back sheet 210. Similarly, one or more of the photovoltaic devices 100 can be disposed between the third portion 2503 of the front sheet 250 and the fourth portion 2104 of the back sheet 210. Additionally, one or more of the photovoltaic devices 100 can be disposed between the third portion 2103 of the back sheet 210 and the second portion 2102 of the back sheet 210 allowing the first curved portion 2115 to compress regions of the laminated structure of the photovoltaic apparatus 1000 that include one or more of the photovoltaic devices 100, which can help prevent delamination in these regions. Similarly, one or more of the photovoltaic devices 100 can be disposed between the fifth portion 2105 of the back sheet 210 and the fourth portion 2104 of the back sheet 210 allowing the second curved portion 2116 to compress regions of the laminated structure of the photovoltaic apparatus 1000 that include one or more of the photovoltaic devices 100, which can help prevent delamination in these regions.

FIG. 2A is a side view of a photovoltaic assembly 2000, according to one embodiment. FIG. 2B is a close-up side view of a supporting beam 1600 included in the photovoltaic assembly 2000, according to one embodiment. The photovoltaic assembly 2000 includes a first photovoltaic apparatus 1000-1 and a second photovoltaic apparatus 1000-2. The photovoltaic assembly 2000 further includes a first supporting beam 1600-1, a second supporting beam 1600-2, and a third supporting beam 1600-3. In some embodiments, each supporting beam 1600 can be an I-beam. Each supporting beam 1600 includes a first supporting channel 1611 and a second supporting channel 1612. Each supporting channel 1611, 1612 (FIG. 2B) includes a first member 1601, a second member 1602 opposing the first member 1601, and a connecting member 1603 joining the first member 1601 to the second member 1602. In the embodiment shown, the first member 1601 and the second member 1602 can each be substantially at a right angle with respect to the connecting member 1603. However, in other embodiments, the first member 1601 and the second member 1602 can each be at angles other than right angles with respect to the connecting member 1603. Furthermore, in some embodiments one curved member can form the respective channels 1611, 1612.

The rails 2110, 2120 of each photovoltaic apparatus 1000-1, 1000-2 can be fitted into the channels 1611, 1612 of the beams 1600-1, 1600-2, 1600-3. For example, the first rail 2110 of the first photovoltaic apparatus 1000-1 can be placed in the second supporting channel 1612 of the first supporting beam 1600-1, and the second rail 2120 of the first photovoltaic apparatus 1000-1 can be placed in the first supporting channel 1611 of the second supporting beam 1600-2. Similarly, the first rail 2110 of the second photovoltaic apparatus 1000-2 can be placed in the second supporting channel 1612 of the second supporting beam 1600-2, and the second rail 2120 of the second photovoltaic apparatus 1000-2 can be placed in the first supporting channel 1611 of the third supporting beam 1600-3.

The rails 2110, 2120 including the third portion 2103 and fifth portion 2105 and the respective curved portions 2115, 2116 of the back sheet 210 are deformable to enable the rails 2110, 2120 to tightly fit within the corresponding channels 1611, 1612. For example for the first rail 2110, this tight fit enables the third portion 2103 and the curved portion 2115 of the back sheet 210 to apply a pressure back on the front sheet 250 of the photovoltaic apparatus 1000. Furthermore, the supporting channels 1611, 1612 can each include respective angled surfaces 1621, 1622 that portions of the front sheet 250 can contact when the photovoltaic apparatus 1000 is placed in the supporting channels 1611, 1612 of the respective supporting beam 1600. In some embodiments, the busbars 170, 180 are disposed at locations underlying the portions of the front sheet 250 which contacts the respective angled surfaces 1621, 1622 to enable the respective angled surfaces 1621, 1622 to apply a pressure against the portions of the front sheet 250 disposed directly over the busbars 170, 180 to help prevent the front sheet 250 and the busbars 170, 180 from delaminating from the laminated structure of the photovoltaic apparatus 1000. In some embodiments, the angled surfaces 1621, 1622 may include a padding material, such as a polymer, rubber, or fabric to help form a seal against the front sheet 250 of the respective photovoltaic apparatus 1000 to prevent dirt or water ingress into the supporting channels 1611, 1612 of the respective supporting beam 1600.

Placing the photovoltaic apparatuses 1000-1, 1000-2 into the supporting channels 1611, 1612 of the respective supporting beams 1600 also allows the photovoltaic apparatuses 1000-1, 1000-2 to be placed closely together, so that only a minor portion of a supporting surface (e.g., a roof) is not used to generate energy. For example, in some embodiments the second busbar 180 of the first photovoltaic apparatus 1000-1 is spaced apart from the first busbar 170 of the second photovoltaic apparatus 1000-2 by a distance 1510 of from about 0.1 mm to about 300 mm, such as from about 2 mm to about 30 mm, such as from about 3 mm to about 10 mm. Installation of the photovoltaic assembly 2000 can be performed very quickly. For example, once the supporting beams are secured in place, the remainder of the mechanical installation only requires positioning the photovoltaic apparatuses 1000 so that the rails 2110, 2120 fit inside the supporting channels 1611, 1612 of the supporting beams 1600. The simplicity of this mechanical installation reduces the overall costs of installing the photovoltaic system and increases the cost-competitiveness of the photovoltaic system relative to alternatives.

FIG. 3 is a partial side cross sectional view of a photovoltaic apparatus 3000, according to one embodiment. The view shown in FIG. 3 is similar to the view shown on the left-hand side of FIG. 1D of the photovoltaic apparatus 1000. The photovoltaic apparatus 3000 is similar to the photovoltaic apparatus 1000 except that the first leg 407 of the photovoltaic apparatus 1000 is replaced with a first leg 417 in the photovoltaic apparatus 3000, the first rail 2110 of the photovoltaic apparatus 1000 is replaced with a first rail 3110 in the photovoltaic apparatus 3000, and the back sheet 210 of the photovoltaic apparatus 1000 is replaced with a back sheet 310 of the photovoltaic apparatus 3000. The back sheet 310 of the photovoltaic apparatus 3000 includes a first portion 3101 in the intermediate first portion 410, a second portion 3102 in the first leg 417, and a third portion 3103 (first folded portion) extending from a base 417E of the first leg 417. The first leg 417 of the photovoltaic apparatus 3000 includes a first busbar 170-2 that is disposed at a different position from the first busbar 170 of the photovoltaic apparatus 1000. For example, the first busbar 170-2 is disposed between locations of the front sheet 250 and the back sheet 310, which are substantially flat as opposed to being disposed between the curved portions of the front sheet 250 and the back sheet 210 in the photovoltaic apparatus 1000.

Furthermore, the back sheet 310 includes a curved portion 3105 extending from the third portion 3103 towards the front sheet 250. In the photovoltaic apparatus 3000, the curved portion 3105 extends towards an edge 2505 of the front sheet 250 and to a portion of the front sheet 250 directly overlying the first busbar 170-2, so that the curved portion 3105 can apply a pressure to the edge 2505 of the front sheet 250 and to the first busbar 170-2 to help prevent the edge 2505 of the front sheet 250 and the first busbar 170-2 from delaminating from the laminated structure of the photovoltaic apparatus 3000. The edge seal 260 can be disposed between the curved portion 3105 and the front sheet 250 in order to distribute the force from curved portion 3105 over a larger area of the front sheet 250.

Figure 4:
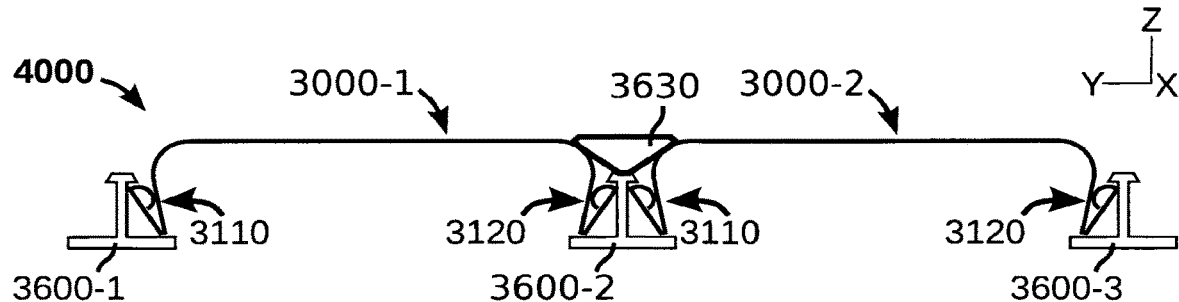
FIG. 4 is a side view of a photovoltaic assembly, according to one embodiment.

FIG. 4 is a side view of a photovoltaic assembly 4000, according to one embodiment. The photovoltaic assembly 4000 is similar to the photovoltaic assembly 2000 described above in reference to FIGS. 2A, 2B except that the photovoltaic assembly 4000 includes photovoltaic apparatuses 3000-1, 3000-2 instead of the photovoltaic apparatuses 1000-1, 1000-2, and includes supporting beams 3600 instead of the supporting beams 1600 described above. The supporting beams 3600 are similar to the supporting beams 1600 described above except that the connecting member 3603 is shorter in the Z-direction than the connecting member 1603, the first member 3601 shorter in the Y-direction than the first member 1601, and the second member 3602 is longer in the Y-direction than the second member 1602. Furthermore, the photovoltaic assembly 4000 includes an inter-module cover 3630 disposed on the first member 3601 of the supporting beams 3600 that are between photovoltaic apparatuses 3000. The inter-module cover 3630 may be flush with the front sheets 250 of toe photovoltaic apparatuses 3000. Furthermore, the inter-module cover 3630 may form a seal to prevent dirt and water ingress between the photovoltaic apparatuses. In some embodiments, the inter-module cover 3630 may be bonded to the corresponding supporting beam 3600 or be an integral part of the corresponding beam 3600. Furthermore, in some embodiments, the inter-module cover 3630 may be formed of a metal, a polymer, a fiber-reinforced composite, and/or a rubber material.

Figure 5:
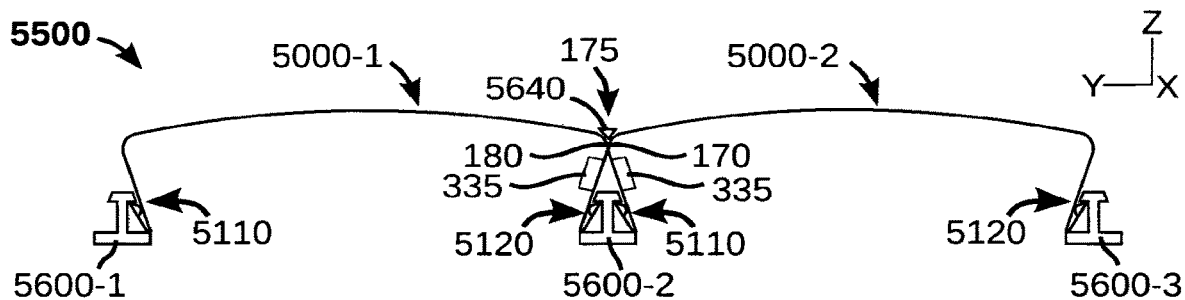
FIG. 5 is a side view of a photovoltaic assembly, according to one embodiment.

In other embodiments, the shape of the photovoltaic apparatuses and the shape of the supporting channels of the supporting beams may be further modified, so that the front sheets 250 of adjacent photovoltaic apparatuses contact each other or approach contacting each other and the inter-module cover 3630 is not needed, or a smaller inter-module cover can be used. For example, FIG. 5 shows a side view of a photovoltaic assembly 5500, according to such an embodiment. The photovoltaic assembly 5500 includes a first photovoltaic apparatus 5000-1 and a second photovoltaic apparatus 5000-2. The photovoltaic assembly 5500 further includes a first supporting beam 5600-1, a second supporting beam 5600-2, a third supporting beam 5600-3. The photovoltaic apparatuses 5000-1, 5000-2 each include a first rail 5110 and a second rail 5210. The rails 5110, 5210 of the photovoltaic apparatuses 5000-1, 5000-2 are placed within the supporting channels of the respective beams 5600-1, 5600-2, 5600-3 in a similar fashion as described above in reference to the photovoltaic assembly 2000 shown in FIG. 2A.

The front sheets 250 of the photovoltaic apparatuses 5000-1, 5000-2 can contact each other over the second supporting beam 5600-2 at a point of contact 175. Thus, the photovoltaic apparatuses 5000-1, 5000-2 can each apply pressure to the front sheet 250 of the other photovoltaic apparatus at the point of contact 175 to assist in preventing delamination of the front sheets 250 of the respective photovoltaic apparatuses 5000. Furthermore, the second busbar 180 of the first photovoltaic apparatus 5000-1 and the first busbar 170 of the second photovoltaic apparatus 5000-2 can directly underlie the portions of the respective front sheet 250 that contacts the front sheet 250 of the adjacent photovoltaic apparatus 5000 to assist in preventing delamination of the busbars 170, 180 from the laminated structure of the corresponding photovoltaic apparatus 5000. Furthermore, because the front sheets 250 of the adjacent photovoltaic apparatuses 5000 contact each other, a higher proportion of the supporting structure (e.g., a roof) can be used to produce photovoltaic energy relative to photovoltaic assemblies where at least some spacing exists between the photovoltaic apparatuses. In some embodiments, a filler 5640 (e.g., a butyl filler) may be placed between the adjacent photovoltaic apparatuses 5000 to prevent any ingress of water or dirt between the photovoltaic apparatuses 5000.

Furthermore, in some embodiments one or more junction boxes 335 similar to the junction box 330 described above (FIG. 1A) may be placed against one or more legs of the photovoltaic apparatuses 5000. In some embodiments, the junction box 335 may be placed against the back side of the leg, i.e., the leg portion that is part of the concave surface formed by the photovoltaic apparatus 1000. In some embodiments, the junction box 335 may be placed in the void created between the photovoltaic apparatuses 5000 below the contact point 175. Placing the junction box 335 at these locations allows easy electrical connections between the photovoltaic apparatuses 5000 and places the junction box in a protected environment beneath the filler 5640.

Figure 6:
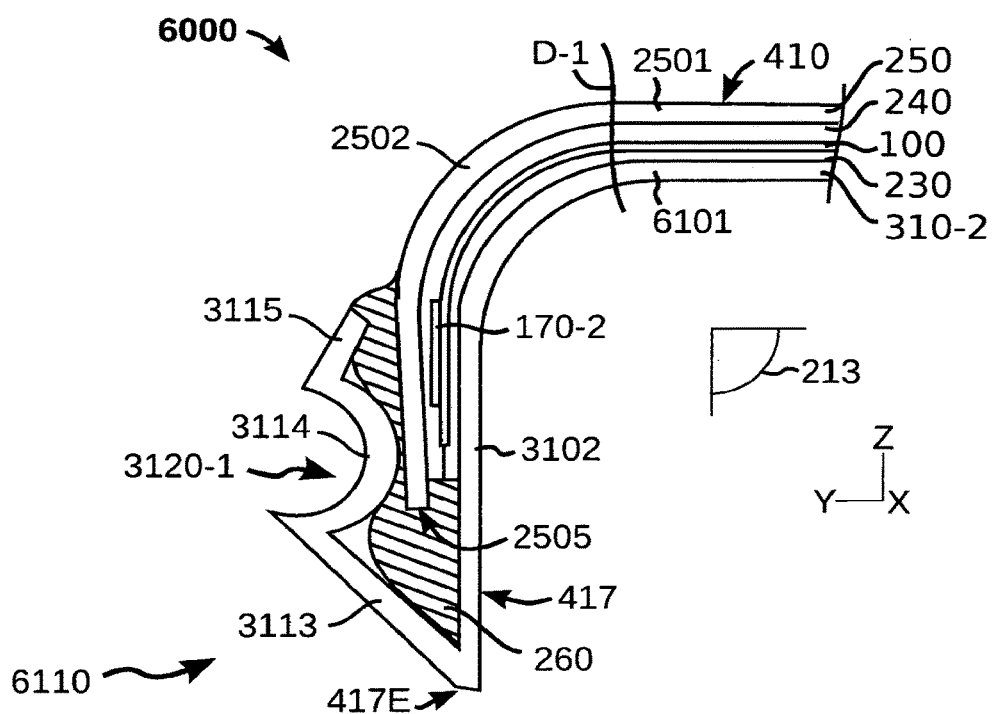
FIG. 6 is a partial side cross sectional view of a photovoltaic apparatus 6000, according to one embodiment.

FIG. 6 is a partial side cross sectional view of a photovoltaic apparatus 6000, according to one embodiment. The photovoltaic apparatus 6000 is similar to the photovoltaic apparatus 3000 except that the photovoltaic apparatus 6000 includes a modified back sheet 310-2. The back sheet 310-2 includes a third portion 3113 extending outward of the intermediate first portion 410 from the base 417E of the first leg 417. The back sheet 310-2 further includes a fourth portion 3114 extending inward towards the front sheet 250 from the third portion 3113. The inwardly extending fourth portion 3114 has an outer surface forming a first slot 3120-1 facing away from the front sheet 250. In some embodiments, the slot 3120-1 can be substantially in the shape of a semi-circle or some other portion of a circle or other shape, such as a polygon. The back sheet 310-2 further includes a fifth portion 3115 extending inwardly towards the front sheet 250 from the fourth portion 3114. Together, the third portion 3113, the fourth portion 3114, and the fifth portion 3115 form a first rail 6110 of the photovoltaic apparatus 5000. The combined shape of the third portion 3113, the fourth portion 3114, and the fifth portion 3115 may help prevent the collection of debris or other material within the space formed between the first rail 6110 and the front sheet 250. The combined shape of the third portion 3113, the fourth portion 3114, and the fifth portion 3115 may also allow the material used to form the edge seal 260 to be easily positioned and retained within the formed space to further prevent the ingress of environmental contamination near the edge of the photovoltaic assembly.

Figure 7:
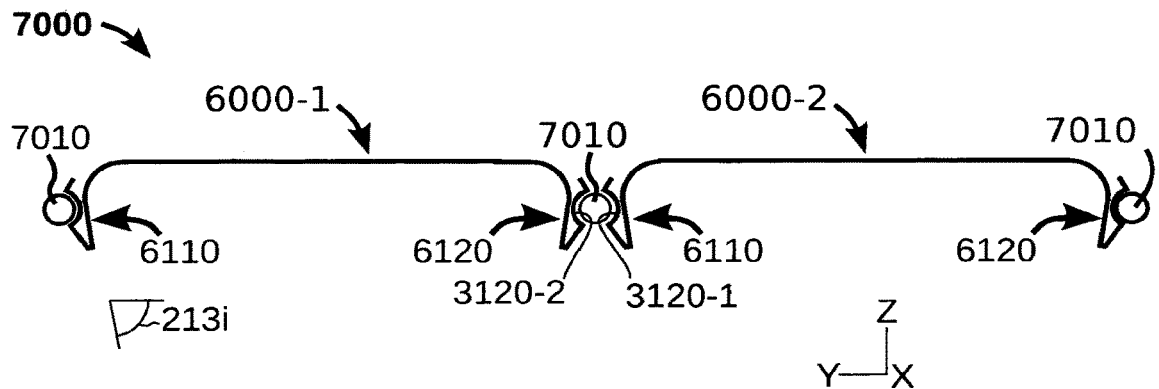
FIG. 7 is a side view of a photovoltaic assembly, according to one embodiment.

FIG. 7 is a side view of a photovoltaic assembly 7000, according to one embodiment. The photovoltaic assembly 7000 includes a first photovoltaic apparatus 6000-1 and a second photovoltaic apparatus 6000-2. Each photovoltaic apparatus 6000 includes a first rail 6110 (described above) and a second rail 6120. The second rail 6210 can be a mirror image of the 6110. Thus, the second rail 6210 can include a slot 3120-2 that is the mirror image of the slot 3120-1 described above. The photovoltaic apparatuses 6000 can be placed adjacent to each other, so that the slots 3120-1, 3120-2 are aligned directly next to each other and a cable 7010 can extend through the slots 3120-1, 3120-2. The cables 7010 can be secured to a supporting structure (e.g., a roof) and the photovoltaic apparatuses 6000 can be positioned so that the corresponding slots 3120 of the photovoltaic apparatuses 6000 fit around the cables 7010, which secures the photovoltaic apparatuses 6000 in place. The angle 2131 shows that the angle of the legs, such as the first leg 417, relative to the intermediate first portion 410 is reduced after installation in the photovoltaic assembly 7000 relative to the angle 213 (FIG. 6) before installation.

Referring to FIG. 6, the slots 3120 can include an edge 3125, where the fourth portion 3114 meets the third portion 3113. The edge 3125 can act as a catch, so that wind or other disturbances do not remove the photovoltaic apparatuses 6000 from their installed location that is secured by placing the slots 3120 around respective cables 7010. In some embodiments, a rod, bar or similar object may be used in place of the cable 7010. Installation of the photovoltaic assembly 7000 can be performed very quickly. For example, once the cables 7010 are secured in place, the remainder of the mechanical installation only requires positioning the photovoltaic apparatuses 6000 so that the corresponding slots 3120 of the photovoltaic apparatuses 6000 fit around the cables 7010.

Although the photovoltaic apparatus 6000 was described as having a first rail 6110 extending from the first leg 417 of photovoltaic apparatus 6000, in other embodiments, more than one rail can extend from the first leg 417, such as two or more rails each having a slot for engaging a cable, such as cable 7010. Using multiple rails with multiple slots for engaging multiple cables can help distribute the forces encountered by the photovoltaic apparatuses when secured to cables, such as the cable 7010. Furthermore, embodiments using cables to secure the photovoltaic apparatuses to the corresponding photovoltaic assembly can also adopt one or more of the beneficial features described above in reference to the embodiments using the supporting beams, such as the embodiments described in reference to FIGS. 1-5. For example, an embodiment, using cables to secure the photovoltaic apparatuses to a photovoltaic assembly could also be designed so that the front sheets 250 (FIG. 1D) of adjacent photovoltaic apparatuses could contact each other at point similar to the contact point 175 described above in reference to FIG. 5 to help prevent delamination of the front sheet 250 and busbars 170, 180 underlying the contact point between the front sheets 250.

Figure 8:
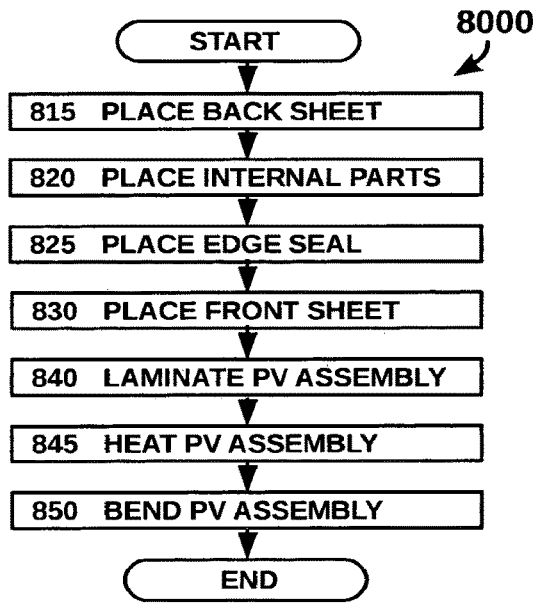
FIG. 8 is a process flow diagram of a method for forming the photovoltaic apparatus of FIG. 1D, according to one embodiment.

FIG. 8 is a process flow diagram of a method 800 for forming the photovoltaic apparatus 1000 of FIG. 1D, according to one embodiment. At block 815, the back sheet 210 is provided. At block 820, the internal components of the photovoltaic apparatus 1000 are placed onto the back sheet 210. These internal components can include the back-side adhesive 230, the substrate 110, the photovoltaic device 100, the front-side adhesive 240, and the rovings 220. At block 825, the edge seal 260 is placed onto the back sheet 210 surrounding the internal components of the photovoltaic apparatus 1000. In some embodiments, the edge seal material is placed around areas which will contact the edges of the front sheet 250.

At block 830, the front sheet 250 is placed over the internal components of the photovoltaic apparatus 1000 and the edge seal 260 to form a photovoltaic assembly that can include the back sheet 210, the back-side adhesive 230, the substrate 110, the photovoltaic device 100, the front-side adhesive 240, and the edge seal 260. At block 840, the photovoltaic assembly can be laminated.

At block 845, the photovoltaic assembly can be heated before the folding process. In some embodiments, the photovoltaic assembly may be heated to a temperature from about 75° C. to about 150° C., such as from about 100° C. to about 125° C. At block 850, the folding process is performed on the photovoltaic assembly to form one or more of the legs 407, 408, and the rails 2110, 2120 of the photovoltaic apparatus 1000. Using the back sheet 210 (FIG. 1D) to form the rails 2110, 2120 that are used to secure the photovoltaic apparatuses in the supporting beams 1600 (FIG. 2A) greatly simplifies the process of forming the photovoltaic apparatus 1000 because no extra parts are required to form the rails 2110, 2120 and no extra steps are needed to attach the rails to the photovoltaic apparatus 1000.

Figure 9:
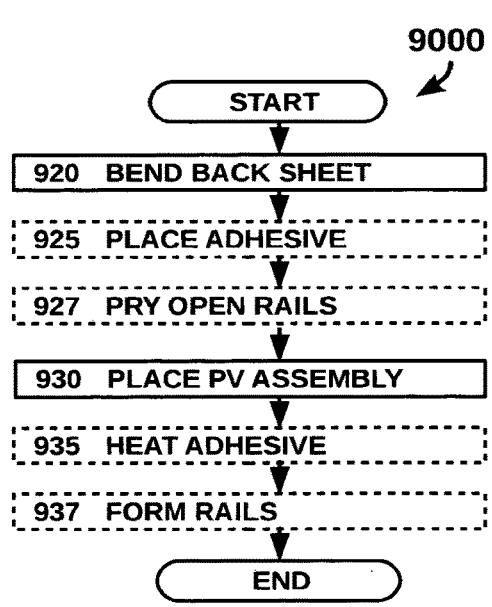
FIG. 9 is a process flow diagram of an alternative method for forming the photovoltaic apparatus of FIG. 1D, according to one embodiment.

FIG. 9 is a process flow diagram of an alternative method 9000 for forming the photovoltaic apparatus 1000 of FIG. 1D, according to one embodiment. At block 920, the back sheet 210 is folded at opposing sides of the back sheet 210 to give the back sheet 210 a shape similar to the shape of the back sheet 210 shown in FIG. 1D. However, in some embodiments only the folds to form the legs 407, 408 are performed in this step and the folds to form the rails 2110, 2120 are performed at a later step. Folding the back sheet 210 in this way allows for the busbars 170, 180 to be placed on areas of the photovoltaic apparatus 6000 that receive little to no light and increase the proportion of a supporting structure's surface area (e.g., surface area of a roof) that can be used to produce energy when multiple photovoltaic apparatuses are placed next to each other. In some embodiments, a plate bending roller assembly can be used to create the folds and the back sheet 210. At block 925, a back sheet adhesive can optionally be placed on the back sheet 210.

At block 927, if the rails 2110, 2120 were formed during block 920, then the rails 2110, 2120 can be pried opened. At block 930, the photovoltaic assembly including the back-side adhesive 230, the substrate 110, the photovoltaic device 100, the front-side adhesive 240, the front sheet 250, and the edge seal 260 can be placed on the back sheet adhesive that was optionally added in block 925. However, in some embodiments the photovoltaic assembly can be placed directly on the back sheet 210 if the back sheet adhesive is not used. At block 935, the photovoltaic apparatus 1000 is optionally heated to improve adhesion between the photovoltaic assembly and the back sheet 210. A laminator adapted to process curved plates can be used to heat the photovoltaic apparatus 1000 during block 935. The heat provided at block 935 can melt or partially melt one or more of the layers, such as the adhesive layers 230, 240 or the edge seal 260, to promote adhesion between the different layers in the photovoltaic apparatus 1000. At block 937, if the rails 2110, 2120 were not formed during block 920, the back sheet 210 can be folded at this point to form the rails 2110, 2120.

While the foregoing is directed to embodiments of the present disclosure, other and further embodiments of the disclosure may be devised without departing from the basic scope thereof, and the scope thereof is determined by the claims that follow.

The invention claimed is:

1. A photovoltaic assembly, comprising:
   one or more supporting beams, each of the one or more supporting beams comprising a supporting channel having a first surface; and
   a photovoltaic apparatus placed in the supporting channel of each of the one or more supporting beams, the photovoltaic apparatus comprising:
   a front sheet comprising a first portion and a second portion; a back sheet comprising a first portion, a second portion having a base end opposite to the first portion, and a first folded portion;
   one or more photovoltaic devices disposed between the first portion of the front sheet and the first portion of the back sheet, wherein each of the one or more photovoltaic devices includes an array of photovoltaic cells; and
   a busbar disposed between the first folded portion of the back sheet and the second portion of the back sheet.

2. The photovoltaic assembly of claim 1, wherein the busbar is disposed at between the base end of the second portion of the back sheet and a first location of the front sheet that contacts the first surface.

3. The photovoltaic assembly of claim 1, wherein the first surface is angled.

4. The photovoltaic assembly of claim 1, wherein the first surface comprises a padding material selected from a polymer, a rubber, and a fabric.

5. The photovoltaic assembly of claim 1, wherein the back sheet further comprises a rail extending from the base end of the second portion of the back sheet away from the first portion of the back sheet, and the rail is configured to be fitted into the supporting channel of each of the one or more supporting beams.

6. The photovoltaic assembly of claim 5, wherein the back sheet further comprises a curved portion extending from the rail to the front sheet and contacting the second portion of the front sheet.

7. The photovoltaic assembly of claim 1, wherein each of the one or more supporting beams comprises a first member, a second member opposing the first member, and a connecting member joining the first member to the second member.

8. A method of forming a photovoltaic assembly, comprising:
    placing a photovoltaic apparatus into a supporting channel of each of the one or more supporting beams, the supporting channel having a first surface, wherein the photovoltaic apparatus comprises:
    a front sheet comprising a first portion and a second portion;
    a back sheet comprising a first portion, a second portion having a base end opposite to the first portion, and a first folded portion;
    one or more photovoltaic devices disposed between the first portion of the front sheet and the first portion of the back sheet, wherein each of the one or more photovoltaic devices includes an array of photovoltaic cells; and
    a busbar disposed between the first folded portion of the back sheet and the second portion of the back sheet.

9. The method of claim 8, wherein the busbar is disposed at between the base end of the second portion of the back sheet and a first location of the front sheet that contacts the first surface.

10. The method of claim 8, wherein the first surface is angled.

11. The method of claim 8, wherein the first surface comprises a padding material selected from a polymer, a rubber, and a fabric.

12. The method of claim 8, wherein the back sheet further comprises a rail extending from the base end of the second portion of the back sheet away from the first portion of the back sheet, and the rail is configured to be fitted into the supporting channel of each of the one or more supporting beams.

13. The method of claim 12, wherein the back sheet further comprises a curved portion extending from the rail to the front sheet and contacting the second portion of the front sheet.

14. The method of claim 8, wherein each of the one or more supporting beams comprises a first member, a second member opposing the first member, and a connecting member joining the first member to the second member.

15. A photovoltaic assembly, comprising:
    one or more supporting beams, each of the one or more supporting beams comprising a supporting channel; and
    a photovoltaic apparatus placed in the supporting channel of each of the one or more supporting beams, the photovoltaic apparatus comprising:
    a front sheet comprising a first portion and a second portion having a first edge;
    a back sheet comprising a first portion, a second portion having a base end opposite to the first portion, and a first folded portion;
    one or more photovoltaic devices disposed between the first portion of the front sheet and the first portion of the back sheet, wherein each of the one or more photovoltaic devices includes an array of photovoltaic cells; and
    a busbar disposed between the second portion of the front sheet and the second portion of the back sheet.

16. The photovoltaic assembly of claim 15, wherein the back sheet further comprises a rail extending from the base end of the second portion of the back sheet away from the first portion of the back sheet, and the rail is configured to be fitted into the supporting channel of each of the one or more supporting beams.

17. The photovoltaic assembly of claim 16, wherein the back sheet further comprises a curved portion extending from the rail to the first edge of the front sheet and contacting a portion of the front sheet directly overlying the busbar.

18. The photovoltaic assembly of claim 15, wherein each of the one or more supporting beams comprises a first member, a second member opposing the first member, and a connecting member joining the first member to the second member.

19. The photovoltaic assembly of claim 15, wherein the first member is shorter than the second member.

20. The photovoltaic assembly of claim 15, further comprising an inter-module cover disposed on the first member of each of the one or more supporting beams.

* * * * *